United States Patent
Voelkel

(10) Patent No.: US 9,246,481 B2
(45) Date of Patent: Jan. 26, 2016

(54) SYSTEM AND METHOD FOR A DYNAMIC VOLTAGE CONTROLLED OSCILLATOR

(71) Applicant: NVIDIA Corporation, Santa Clara, CA (US)

(72) Inventor: Eric H. Voelkel, Ben Lomond, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 14/162,692

(22) Filed: Jan. 23, 2014

(65) Prior Publication Data
US 2015/0207501 A1 Jul. 23, 2015

(51) Int. Cl.
| | |
|---|---|
| H03L 7/085 | (2006.01) |
| H03K 5/159 | (2006.01) |
| G06F 1/08 | (2006.01) |
| G11C 7/22 | (2006.01) |
| H03L 7/095 | (2006.01) |
| H03K 3/011 | (2006.01) |

(52) U.S. Cl.
CPC *H03K 5/159* (2013.01); *G06F 1/08* (2013.01); *G11C 7/22* (2013.01); *H03K 3/011* (2013.01); *H03L 7/095* (2013.01)

(58) Field of Classification Search
CPC .......... G11C 7/22; G11C 7/222; G11C 7/227; H03L 7/095; H03F 3/217; G06F 1/08
USPC ........... 327/153, 141; 365/194, 222; 713/400; 331/1 A
See application file for complete search history.

(56) References Cited

U.S. PATENT DOCUMENTS

| | | | | |
|---|---|---|---|---|
| 8,264,261 | B2* | 9/2012 | Grollitsch | 327/158 |
| 8,601,427 | B2* | 12/2013 | Kawagoe | 716/134 |
| 2010/0039157 | A1* | 2/2010 | Kaeriyama et al. | 327/292 |

* cited by examiner

*Primary Examiner* — Arnold Kinkead
(74) *Attorney, Agent, or Firm* — Zilka-Kotab, PC

(57) ABSTRACT

A system and method are provided for generating an adaptive clock signal, configured to track prevailing operating conditions within an integrated circuit. The method comprises transmitting a first signal edge to a row of cells within a memory instance, waiting for two or more selected cells within the row of cells to propagate corresponding responses based on the first signal edge, and generating a memory delay signature signal edge based on the corresponding responses. The adaptive clock signal is generated based on the delay signature signal edge.

20 Claims, 12 Drawing Sheets

SYSTEM AND METHOD FOR A DYNAMIC VOLTAGE CONTROLLED OSCILLATOR

FIELD OF THE INVENTION

The present invention relates to clock generation systems, and more specifically to a voltage-controlled oscillator.

BACKGROUND

A typical integrated circuit includes an on-chip power distribution network that is configured to provide a specified supply voltage to circuit elements fabricated within the integrated circuit. Transient operating and loading conditions may cause certain endpoints of the distribution network to exhibit supply droop, whereby the endpoint provides a lower voltage than the specified voltage. A lower supply voltage may increase propagation delays of signals through the circuit elements. Conventional integrated circuits are designed to accommodate supply droop by including an additional voltage margin in the supply voltage to ensure that each circuit element operates according to a specified propagation delay when the voltage provided to the circuit element is within the voltage margin.

A given subsystem of circuit elements may be configured to perform certain operations within the integrated circuit. The subsystem may exhibit a certain propagation delay, which dictates a maximum operating speed for the subsystem. A typical integrated circuit includes a plurality of such subsystems, whereby the longest propagation delay among the plurality of subsystems defines the overall operating speed of the integrated circuit.

In many applications, operating the integrated circuit at a maximum system performance level within a constrained power budget is desirable. To achieve maximum system performance (i.e., minimizing the longest propagation delay), the voltage margin is set to a value that substantially guarantees an adequate supply voltage for operation at the maximum system performance level. A consequence of setting the voltage margin in this way is that system performance levels may be achieved at the expense of power efficiency.

Thus, there is a need for addressing this issue and/or other issues associated with the prior art.

SUMMARY

A system and method are provided for generating an adaptive clock signal. The method comprises transmitting a first signal edge to a row of cells within a memory instance, waiting for two or more selected cells within the row of cells to propagate corresponding responses based on the first signal edge; and generating a memory delay signature signal edge based on the corresponding responses. The adaptive clock signal is generated based on the delay signature signal edge.

Other embodiments comprise an integrated circuit including a digital voltage controlled oscillator configured to perform the above method.

DETAILED DESCRIPTION

A technique is provided for generating an adaptive clock signal based on prevailing delay characteristics of operating circuit elements within an integrated circuit. Delay structures are implemented within an integrated circuit to provide high-fidelity models of circuit elements within a given clock domain. The delay structures are configured to model each different type of representative delay path within the clock domain. In one embodiment, the delay structures include a memory delay structure configured to model signal propagation through a memory instance, at least one logic delay structure configured to model propagation through representative logic cells, and a wiring delay structure configured to model propagation through representative wiring paths. Each delay structure exhibits a delay signature based on fabrication parameters for the integrated circuit, as well as prevailing operating conditions that include operating temperature and operating voltage.

A system delay signature combines two or more individual delay signatures to represent the longest propagation time of each constituent delay structure. More specifically, the propagation time for a rising edge associated with the system delay signature is represented by the longest propagation time for a rising edge through each constituent delay structure, and the propagation time for a falling edge associated with the system delay signature is represented by the longest propagation time for a falling edge through each constituent delay structure.

A dynamic voltage controlled oscillator (DVCO) includes the delay structures within an oscillation feedback path configured to generate an adaptive clock signal based on the system delay signature of the delay structures. The system delay signature tracks prevailing operating conditions within the integrated circuit, enabling the DVCO to dynamically generate the adaptive clock signal according to the prevailing operating conditions.

Figure 1A:
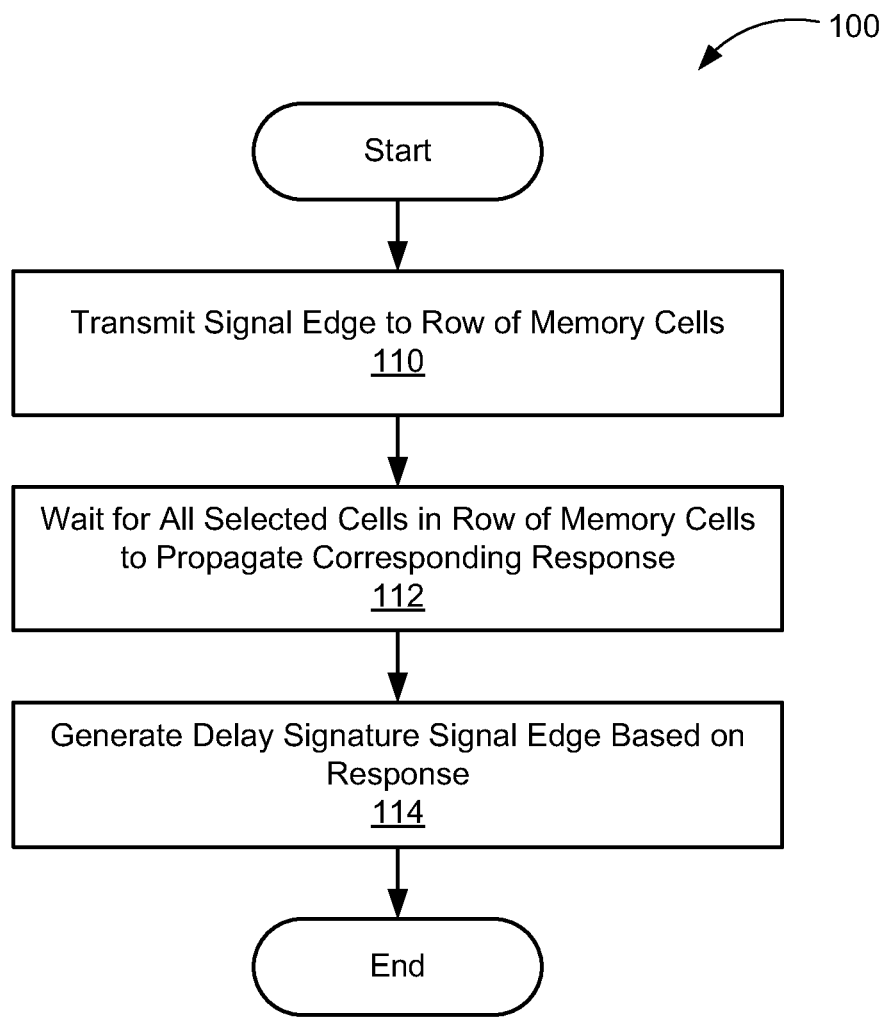
FIG. 1A illustrates a flow chart of a method for generating a delay signature for a memory circuit, in accordance with a first embodiment.

FIG. 1A illustrates a flow chart of a method 100 for generating a delay signature for a memory circuit, in accordance with a first embodiment. Although method 100 is described in the context of certain circuit and system implementations described in FIGS. 2, 3A, 4A, and 5A through 5C, the method 100 may also be performed by other custom circuitry. Furthermore, persons of ordinary skill in the art will understand that any system that performs method 100 is within the scope and spirit of embodiments of the present invention. Method 100 may be performed by a memory delay structure within a DVCO, such as memory delay structure 320 within DVCO 220 of FIG. 2. In one embodiment, method 100 is repeated during normal operation of the DVCO to dynamically generate an adaptive clock signal for associated clock domain circuitry.

Method 100 begins in step 110, where the memory delay structure transmits an edge signal to a row of memory cells. The row of memory cells may comprise an instance of a row of memory cells within a memory array instance configured to serve as a representative model of memory arrays within the clock domain circuitry. An edge signal is a transition of a signal from a logical high level to a logical low level (e.g., negative edge or falling edge) or from a logical low level to a logical high level (e.g., positive edge or rising edge). In step 112, the memory delay structure waits for all selected cells in the row of memory cells to propagate a corresponding response to the edge signal. All selected cells comprise two or more cells within the row of memory cells. In one embodiment, all selected cells within the row of memory cells comprise two or more cells, with one memory cell disposed mid-row, and one memory cell disposed at the end of the corresponding row of memory cells. In step 114, the memory delay structure generates a delay signature signal edge based on the response. The delay signature signal edge is configured to indicate the longest propagation delay through the selected row of memory cells.

Figure 1B:
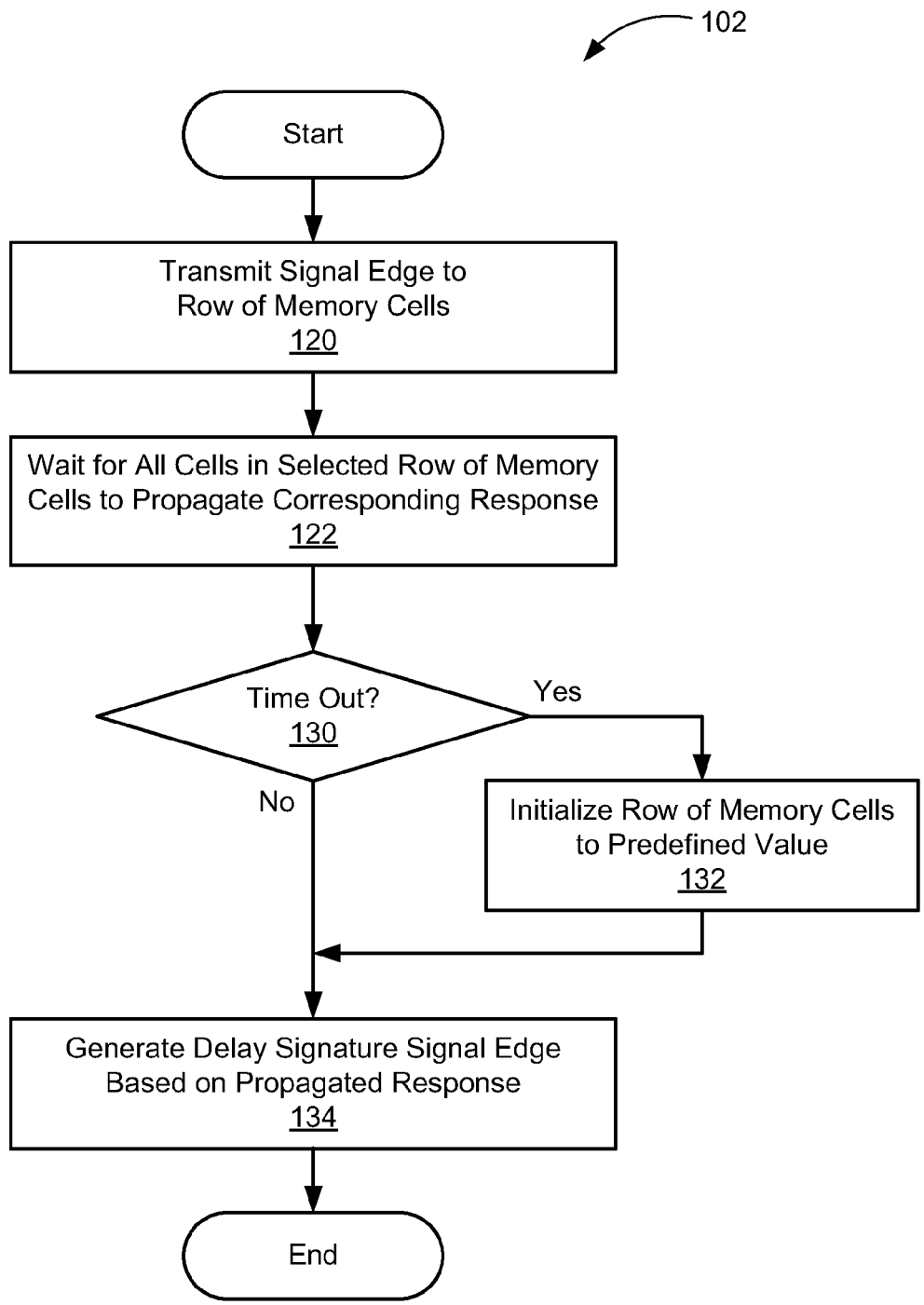
FIG. 1B illustrates a flow chart of a method for generating a delay signature for a memory circuit, in accordance with a second embodiment.

FIG. 1B illustrates a flow chart of a method 102 for generating a delay signature for a memory circuit, in accordance with a second embodiment. Although method 102 is described in the context of certain circuit and system implementations described in FIGS. 2, 3A, 4A, and 5A through 5C, the method 102 may also be performed by other custom circuitry. Furthermore, persons of ordinary skill in the art will understand that any system that performs method 102 is within the scope and spirit of embodiments of the present invention. Method 102 may performed by a memory delay structure within a DVCO, such as memory delay structure 320 within DVCO 220 of FIG. 2. In one embodiment, method 102 is repeated during normal operation of the DVCO to dynamically generate an adaptive clock signal for associated clock domain circuitry.

Method 102 begins in step 120, where the memory delay structure transmits an edge signal to a row of memory cells. The row of memory cells may comprise an instance of a row of memory cells within a memory array instance that is configured to serve as a representative model of memory arrays within the clock domain circuitry. In step 122, the memory delay structure waits for all selected cells within the row of memory cells to propagate a corresponding response to the edge signal. In one embodiment, all selected cells comprise two or more cells within the row of memory cells. In one embodiment, all selected cells comprise two cells, with one cell disposed mid-row, and one cell disposed at the end of the corresponding row or memory cells.

If, in step 130, a time-out interval has not been reached, the method proceeds to step 134, where the memory delay structure generates a delay signature signal edge based on the response. The delay signature signal edge is configured to indicate the longest propagation delay through the selected row of memory cells. Otherwise, before proceeding to step 134, the method completes step 132, where the memory delay structure initializes the row of memory cells to a predefined value. In one embodiment, the predefined value is a logical "1" (one). In another embodiment, the predefined value is a logical "0" (zero).

Figure 1C:
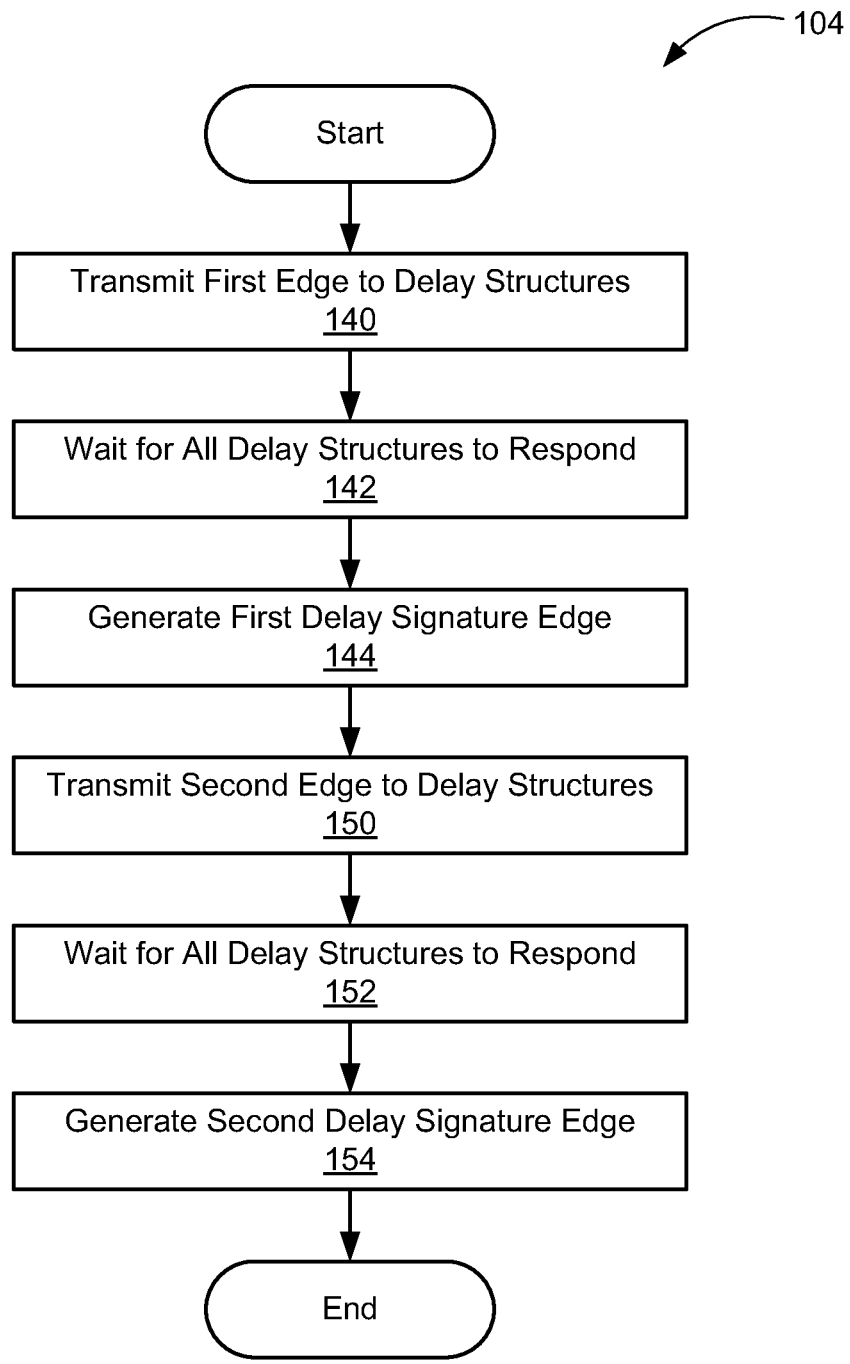
FIG. 1C illustrates a flow chart of a method for generating a delay signature for clock domain circuitry within an integrated circuit, according to one embodiment.

FIG. 1C illustrates a flow chart of a method 104 for generating a delay signature for clock domain circuitry within an integrated circuit, according to one embodiment. Although method 104 is described in the context of certain circuit and system implementations described in FIGS. 2, 3A, 4A, and 5A through 5C, the method 104 may also be performed by other custom circuitry. Furthermore, persons of ordinary skill in the art will understand that any system that performs method 104 is within the scope and spirit of embodiments of the present invention. Method 104 may performed by a DVCO, such as DVCO 220 of FIG. 2. In one embodiment, method 104 is repeated during normal operation of the DVCO to dynamically generate an adaptive clock signal for associated clock domain circuitry.

Method 104 begins in step 140, where the DVCO transmits a first signal edge to delay structures configured to represent respective circuit structures within the clock domain circuitry. In one embodiment, the delay structures comprise a memory delay structure representative of memory instances, one or more logic delay structures representative of logic circuits, and a wiring delay structure representative of wiring structures. In step 142, the DVCO waits for all delay structures to respond to the first signal edge. In one embodiment, responses are transmitted along electrical signal paths that converge within a circuit known in the art as a Muller-c element. The Muller-c element is configured generate a logical one output value after all inputs have transitioned to a logical one, and a logical zero output value after all inputs have transitioned to a logical zero value. The Muller-c element retains a current output state until all inputs have transitioned, enabling the Muller-c element to generate a system delay signature that indicates the longest propagation delay among the delay structures. In step 144, the DVCO generates a first delay signature edge based on the longest propagation delay associated with the first signal edge. The first delay signature edge comprises a first system signature edge, representative of a system propagation delay relative to the first edge.

In step 150, the DVCO transmits a second signal edge to the delay structures. In step 152, the DVCO waits for all delay structures to respond to the second signal edge. In step 154, the DVCO generates a second delay signature edge based on the longest propagation delay associated with the second signal edge. The second signal edge comprises a second system signature edge, representative of a system propagation delay relative to the second edge.

Figure 2:
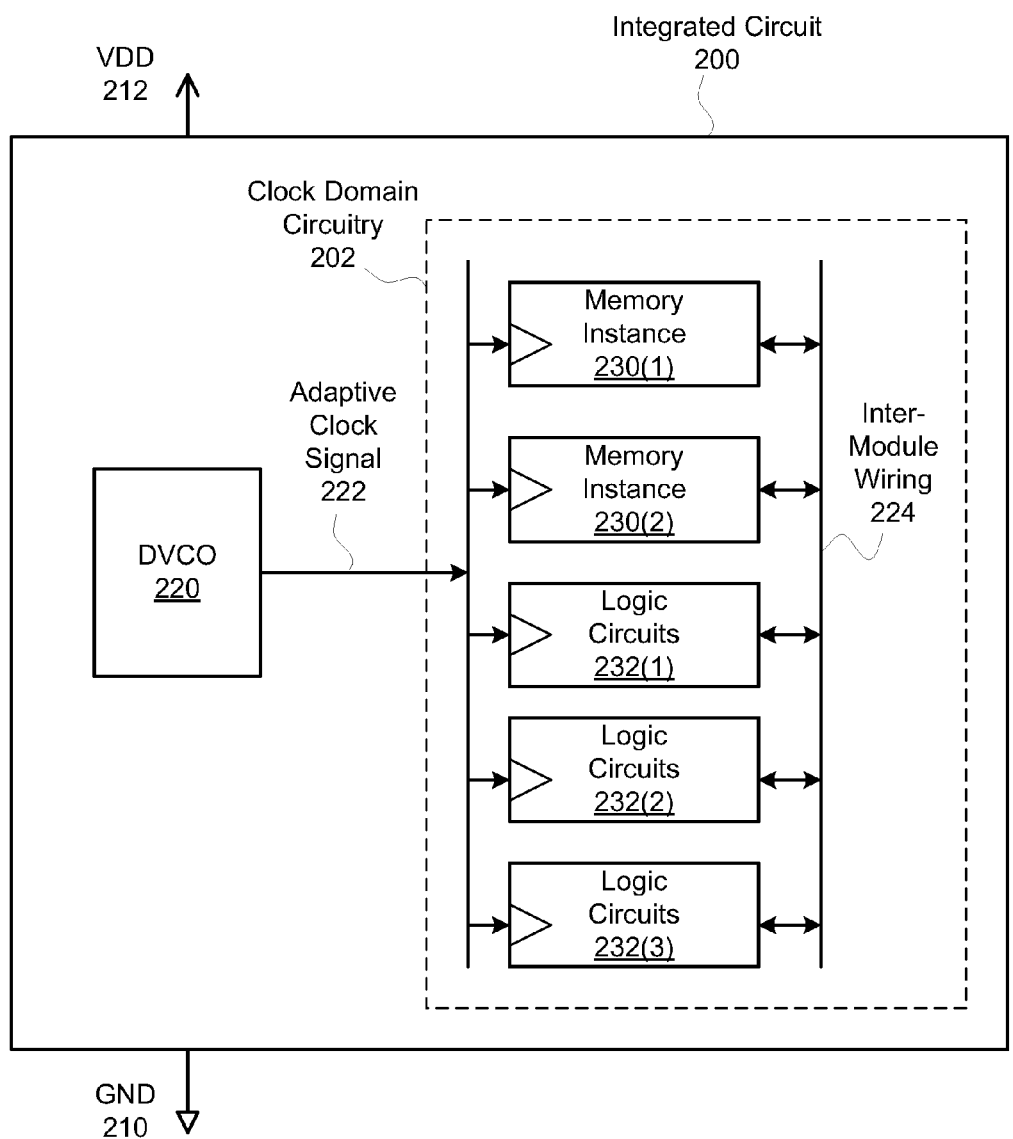
FIG. 2 illustrates an integrated circuit comprising a dynamic voltage controlled oscillator and associated clock domain circuitry, according to one embodiment.

FIG. 2 illustrates an integrated circuit 200 comprising a DVCO 220 and associated clock domain circuitry 202, according to one embodiment. The clock domain circuitry 202 is configured to operate substantially synchronously with respect to an adaptive clock signal 222 generated by the DVCO 220. The clock domain circuitry 202 may include, without limitation, memory instances 230 and logic circuits 232. The memory instances 230 and logic circuits 232 are coupled together through inter-module wiring 224. The memory instances 230, logic circuits 232, and inter-module wiring 224 each have characteristic delay path properties that govern signal propagation time.

During the course of normal operation, a supply voltage delivered from a VDD node 212 and a GND node 210 to circuits within the clock domain circuitry 202 may vary compared with ideal levels. In particular, the supply voltage provided by VDD node 212 may droop. As the supply voltage varies, each different signal propagation time may change, according to voltage-dependence properties of each respective circuit. As die temperature of the integrated circuit 200 changes, each different signal propagation time may change, according to thermal-dependence properties of each respective circuit. The DVCO 220 is configured to dynamically track signal propagation time for each type of characteristic delay path, through representative delay models that emulate voltage variation and thermal variation. The tracking enables the DVCO 220 to generate the adaptive clock signal 220 in accordance with prevailing operating conditions for the integrated circuit 200.

Figure 3A:
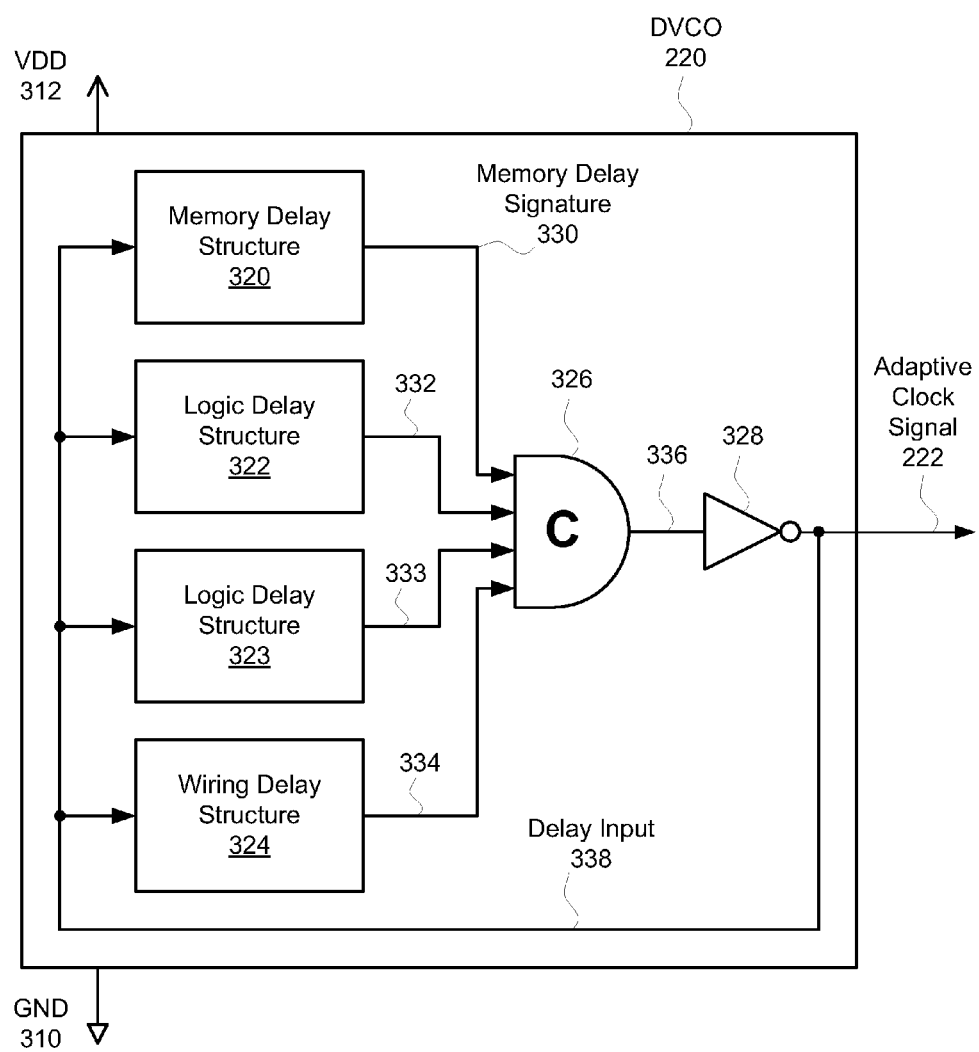
FIG. 3A illustrates a detailed view of the dynamic voltage controlled oscillator shown in FIG. 2, according to one embodiment.

FIG. 3A illustrates a detailed view of the DVCO 220 shown in FIG. 2, according to one embodiment. As shown, DVCO 220 includes a memory delay structure 320, logic delay structures 322, 323, a wiring delay structure 324, and a merge circuit 326, such as a Muller-c element.

A VDD node 312 is supplied by VDD node 212, and a GND node 310 is supplied by GND node 210, through respective conducting supply networks (not shown) included within the integrated circuit 200. The VDD node 312 and GND node 310 supply power to the circuits comprising DVCO 220. A voltage across VDD node 312 and GND node 310 represents an internal supply voltage, which may vary based on instantaneous load conditions within the integrated circuit 200 and any noise on the VDD and GND supplies themselves. The internal supply voltage may droop or increase with respect to the ideal voltage across VDD node 212 and GND node 210, leading to propagation delay variation in one or more of the memory delay structure 320 and logic delay structures 322 and/or 323. Die temperature for the integrated circuit 200 may also impact propagation delay. Propagation delay variation in the wiring delay structure 324 may depend more on fabrication parameters than instantaneous supply voltage or die temperature. DVCO 220 is configured to track propagation delay variation in the clock domain circuitry 202 through representative delay structures comprising the memory delay structure 320, logic delay structures 322, 323, and wiring delay structure 324.

The memory delay structure 320 generates memory delay signature signal 330, which indicates propagation delay through the representative memory delay structure 320. The logic delay structures 322, 323 generate respective logic delay signature signals 332, 333, which indicate respective propagation delays through the representative logic delay structures 322, 323. The wiring delay structure 324 generates wiring delay signature signal 334, which indicates propagation delay through the wiring delay structure 324. The merge circuit 326 generates a system delay signature signal 336, based on the memory delay signature signal 330, the logic delay signature signals 332, 333, and the wiring delay signature signal 334. An inverter 328 buffers and inverts the delay signature signal 336 for feedback to the delay structures as delay input signal 338. The inverter 328 is also configured to generate adaptive clock signal 222 for transmission to the clock domain circuitry 202. In one embodiment, the adaptive clock signal 222 and the delay input signal 338 comprise the same signal, as shown. The adaptive clock signal 222 tracks prevailing operating conditions and provides a synchronous clock source for the clock domain circuitry 202 that satisfies worst-case propagation delays according to dynamic delay models for circuit elements comprising the clock domain circuitry 202.

Figure 3B:
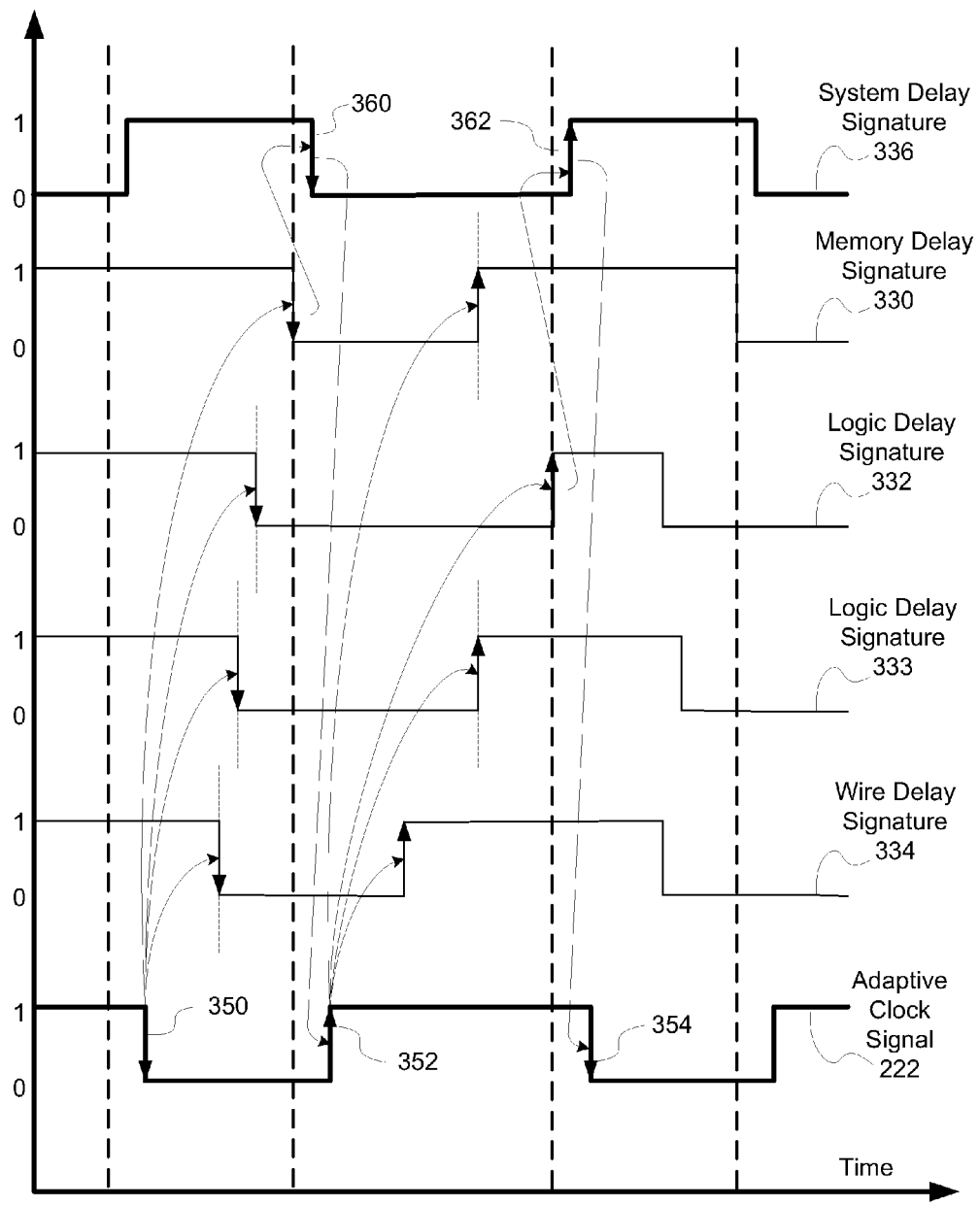
FIG. 3B illustrates operation of a dynamic voltage controlled oscillator configured to generate an adaptive clock signal based on a system delay signature, according to one embodiment.

FIG. 3B illustrates operation of a DVCO, such as DVCO 220 of FIG. 2, configured to generate an adaptive clock signal 222 based on a system delay signature 336, according to one embodiment. As shown, a falling edge 350 on the adaptive clock signal 222 causes corresponding falling edges on memory delay signature signal 330, the logic delay signature signals 332, 333, and the wiring delay signature signal 334 according to corresponding propagation delays. In this example, a propagation delay associated with the memory delay signature signal 330 exhibits the longest propagation delay in response to falling edge 350, and therefore defines timing for falling edge 360 associated with system delay signature signal 336. Falling edge 360 is inverted by inverter 328 to generate rising edge 352. Rising edge 352 then causes corresponding rising edges on memory delay signature signal 330, the logic delay signature signals 332, 333, and the wiring delay signature signal 334 according to corresponding propagation delays. In this example, a propagation delay associated with logic delay signature signal 332 exhibits the longest propagation delay in response to rising edge 352, and therefore defines timing for rising edge 362. Rising edge 362 is inverted by inverter 328 to generate falling edge 354. An oscillation feedback path comprising the delay structures 320, 322, 323, 324, the merge circuit 326, and the inverter 328 is therefore enabled to generate the adaptive clock signal 222, which tracks prevailing delay conditions for the clock domain circuitry 202. The prevailing delay conditions are indicated in delay signature signal 336.

Figure 4A:
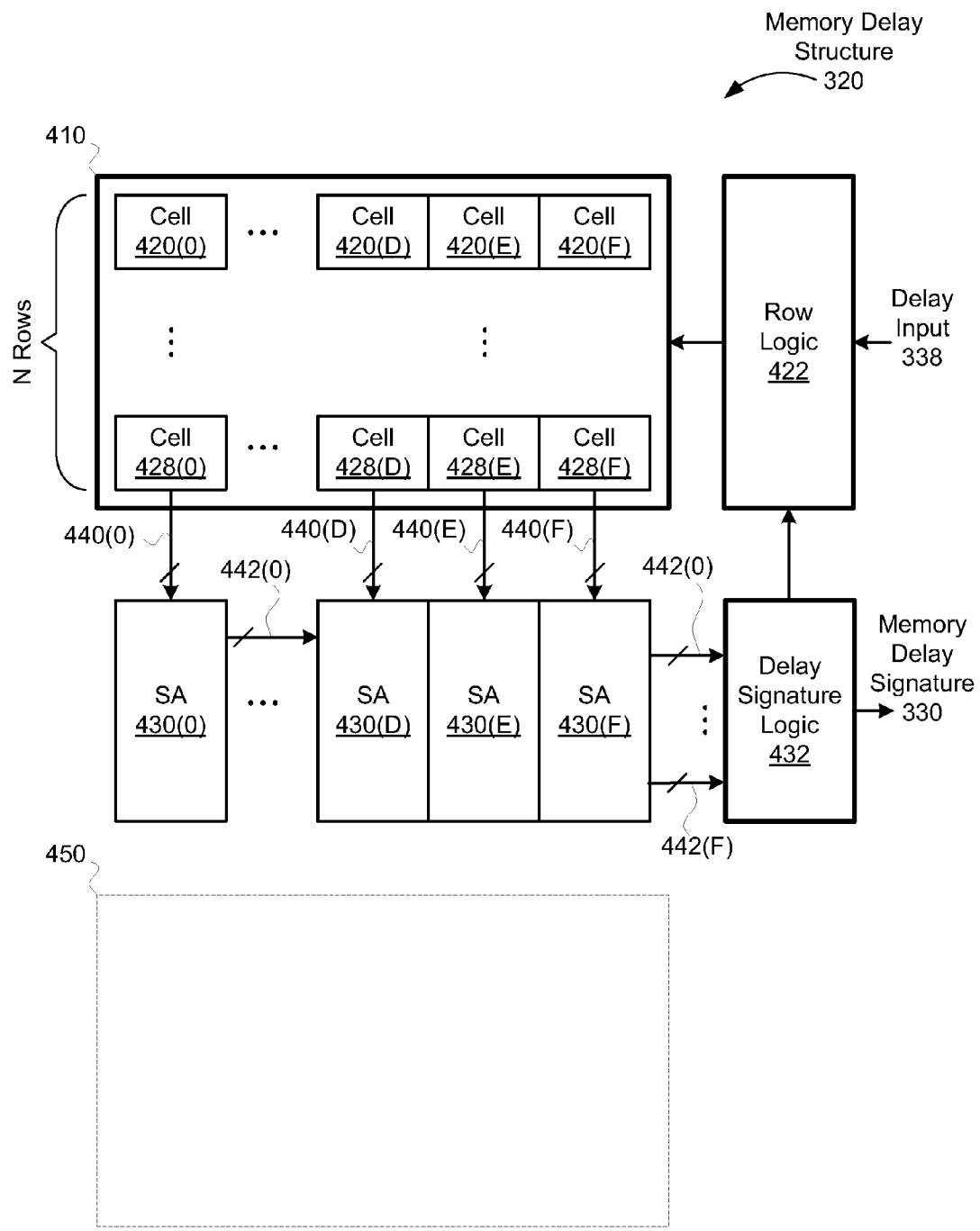
FIG. 4A illustrates a memory delay structure configured to generate a memory delay signature, according to one embodiment.

FIG. 4A illustrates the memory delay structure 320 of FIG. 3A configured to generate a memory delay signature 330, according to one embodiment. As shown, the memory delay structure 320 comprises an array instance 410, which further comprises cells 420 and cells 428. The array instance 410 may include N rows of cells, where N is an arbitrary integer. Each row may include F+1 cells 420, 428, where F is an arbitrary integer. Each cell 420, 428 within in a given column is coupled to a corresponding sense amplifier (SA) 430 through associated column signals 440. In one embodiment, each column signal 440 comprises a pair of differential bit line signals. Each SA output signal 442 is coupled to delay signature logic 432, which combines SA output signals 442 to generate memory delay signature signal 330.

Row logic 422 is configured to access a specified row of memory cells, such as cells 428, in response to receiving an input edge from delay input signal 338. Row logic 422 may include a buffer tree configured to model worst-case column decoder propagation delay. Alternatively, row logic 422 may replicate column decoder logic. Row logic 422 may also be configured to select a row of memory cells 420, 428 to be written in response to an initialization command from the delay signature logic. The initialization command may be issued to initialize a specified row of memory cells 420, 428 to a known-value, such as a value of logical one.

In one embodiment, array instance 410 and SAs 430 implement a physical design consistent with the inclusion of a second array instance 450 that corresponds to a second memory instance. Configuring array instance 410 and SAs 430 to accommodate instance 450 may provide a higher-fidelity delay model for memory instances 230, which are likely to include a second array instance disposed as shown by array instance 450.

In one embodiment, column signals 440 are pre-charged during a pre-charge state prior to SAs 430 reading data from the columns signals 440. In a read state, row logic 422 enables a row select line coupled to the row of memory cells 420, 428, causing each cell within the row of memory cells 420, 428 to be coupled to respective column signals 440. In the read state, each cell transmits an associated logical state to a respective column signal 440. In one embodiment, column signals 440 are pre-charged and held in that state when delay input signal 338 is in a logical zero state and the column signals 440 are released from the pre-charge state and enter the read state when delay input signal 338 is in a logical one state.

Figure 4B:
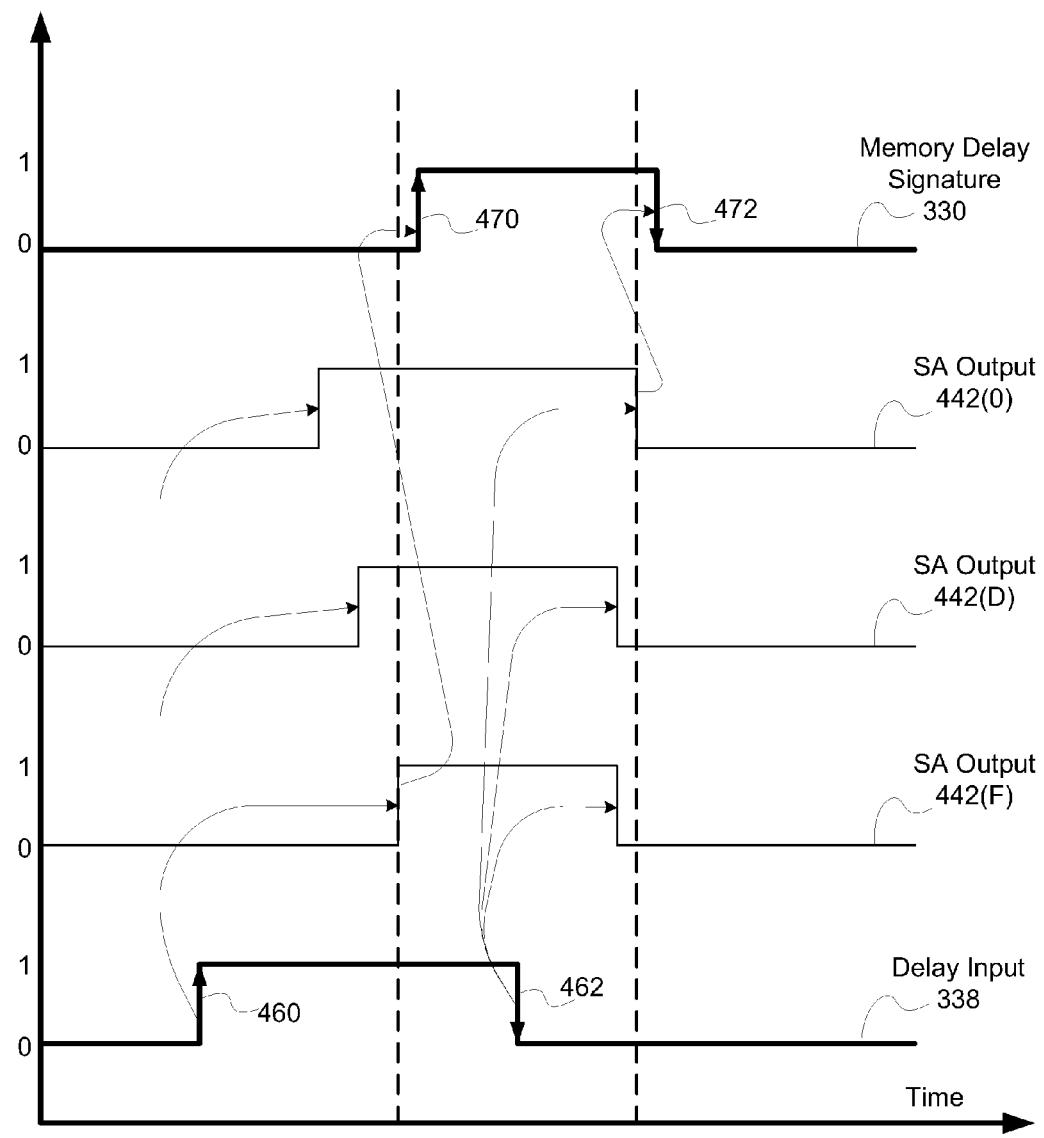
FIG. 4B illustrates operation of a memory delay structure configured to generate a memory delay signature signal, according to one embodiment.

FIG. 4B illustrates operation of a memory delay structure, such as memory delay structure 320 of FIG. 3A, configured to generate a memory delay signature signal 330, according to one embodiment. Memory delay signature 330 is configured to indicate the longest propagation delay through the selected row of memory cells, such as cells 428. As shown, a rising edge 460 on delay input signal 338 causes corresponding rising edges on SA output signals 442. In this example, the rising edge associated with SA output signal 442(F) represents the longest propagation delay through the selected row of memory cells, and therefore defines the timing of rising edge 470 on memory delay signature signal 330. A falling edge 462 on delay input signal 338 causes corresponding falling edges on SA output signals 442. In this example, the falling edge associated with SA output signal 442(0) represents the longest propagation delay through the selected row of memory cells, and therefore defines timing of falling edge 472. Timing for the falling edge 462 may be related to the rising edge 470 or a rising edge from a different delay structure within DVCO 220.

Figure 4C:
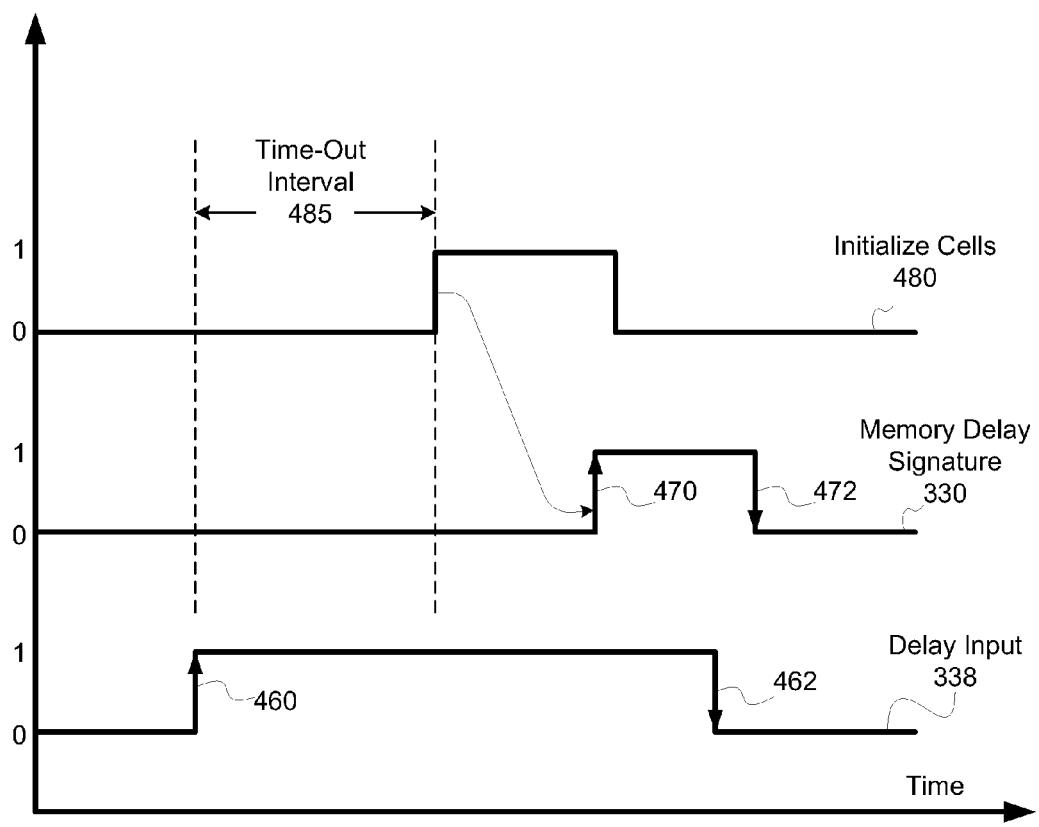
FIG. 4C illustrates operation of a time-out mechanism within a memory delay structure configured to initialize a memory structure, according to one embodiment.

FIG. 4C illustrates operation of a time-out mechanism within a memory delay structure, such as memory delay structure 320 of FIG. 3A, configured to initialize a memory structure, according to one embodiment. A time-out interval 485 is defined as a time interval between rising edge 460 on delay input 338 and rising edge 470 on memory delay signature 330. If rising edge 470 is generated within the time-out interval 485, then the initialize cells signal 480 remains inactive, such as a logical zero. However, if rising edge 470 does not occur within time-out interval 485, as shown, then the initialize cells signal 480 is asserted to a logical one state. In one embodiment, when the initialize cells signal 480 is asserted to a logical one state, a selected row of memory cells is initialized to one. In alternative embodiments, the row of memory cells may be initialized to zero. In memory systems comprising single-ended column signals 440, this time-out event may occur when a row of memory cells is not uniformly initialized. This procedure provides for initializing the row of memory cells for future operation and should only be required when the DVCO 220 is powered-on.

Figure 5A:
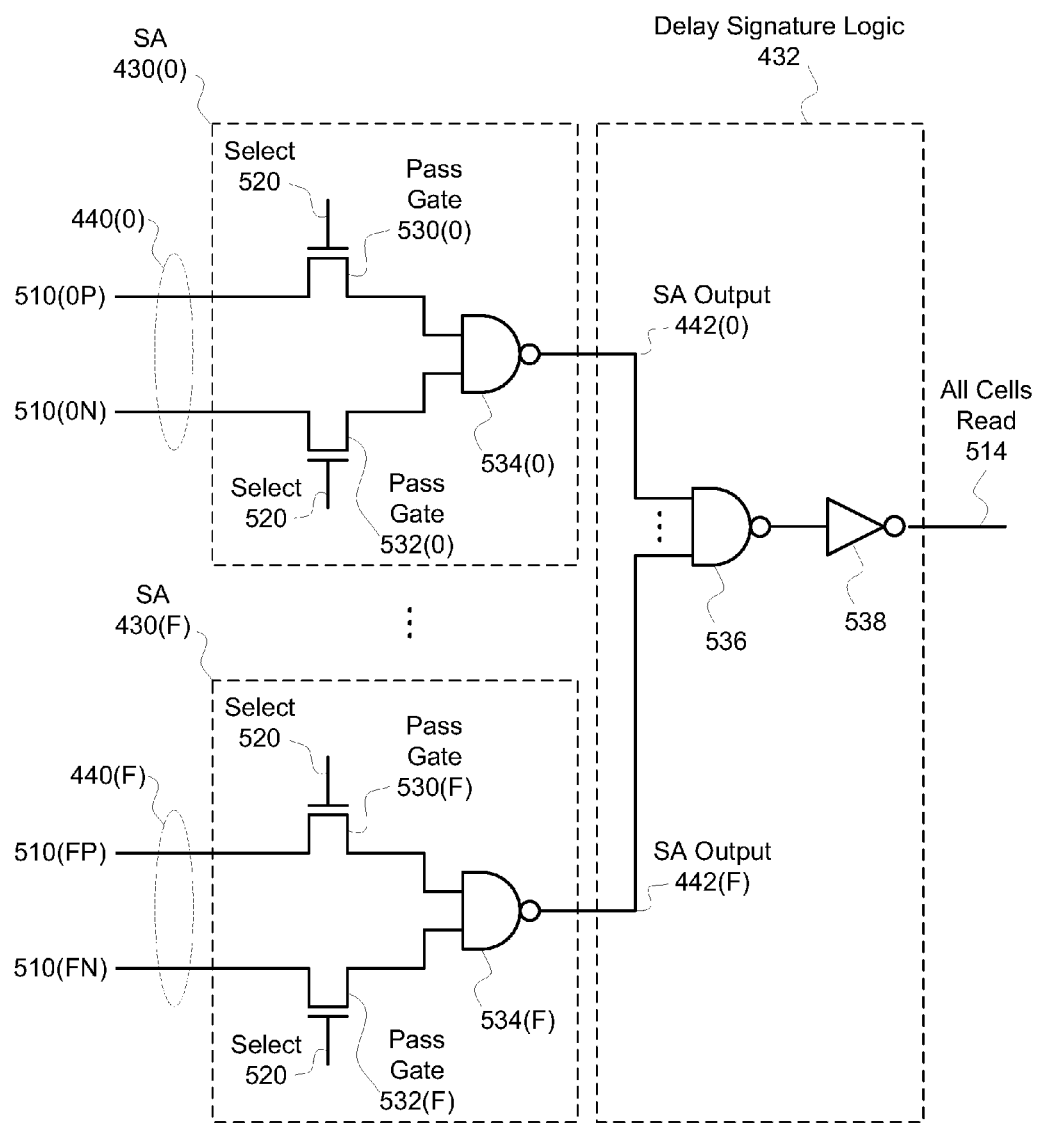
FIG. 5A illustrates a detailed view of delay signature logic comprising the memory delay structure shown in FIG. 3A, according to one embodiment.

FIG. 5A illustrates a detailed view of delay signature logic 432 comprising the memory delay structure 320 shown in FIG. 3A, according to one embodiment. As shown, SAs 430 are configured to generate SA output signals 442, which are merged using merge gate 536. In one embodiment, merge gate 536 comprises a NAND gate. Inverter 538 restores logic sense and buffers an all cells read signal 514.

In one embodiment, each SA 430 comprises pass gates 530, 532 and a sense circuit 534. In certain implementations, the sense circuit 534 comprises a differential sense amplifier. In other embodiments, the sense circuit 534 comprises a logic gate such as a NAND gate. During normal operation, select signal 520 is active, causing each pass gate 530 to couple differential bit lines 510 comprising a respective column signal 440 to an associated sense circuit 534. During a pre-charge state, all bit lines 510 are held in a logical one state, causing all SA output signals 442 to be driven to a logical zero state, which results in the all cells read signal 514 to be driven to a logical zero state. During a read state, one of each pair of differential bit lines 510 will transition to a logical zero state to indicate the state of a corresponding cell. If the internal state of the cell is a one, then the negative sense differential bit line, such as 510(0N) and 510(FN), transitions to zero. If the internal state of the cell is a zero, then the positive sense differential bit line, such as 510(0P) and 510(FP), transitions to zero. Either transition to zero results in a logical one state being driven by a corresponding SA output signal 442. When all SA output signals 442 have been driven to a logical one state, the all cells read signal 514 transitions to a logical one state.

Figure 5B:
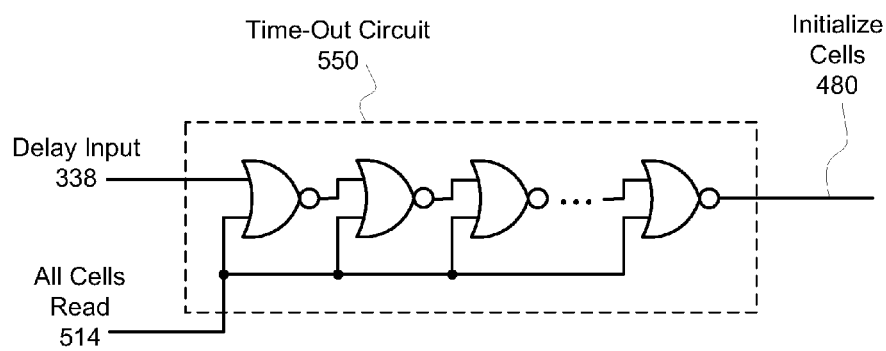
FIG. 5B illustrates a time-out circuit, according to the second embodiment.
Figure 5C:
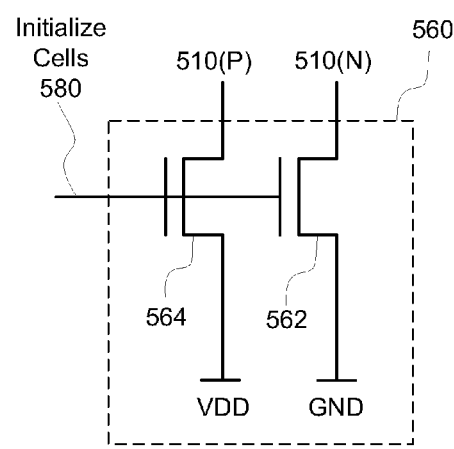
FIG. 5C illustrates a memory cell initialization circuit, according to one embodiment.
Figure 5D:
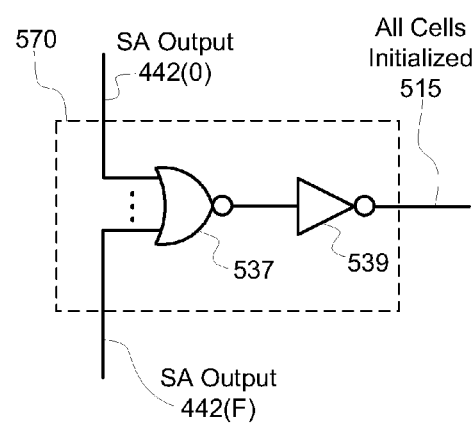
FIG. 5D illustrates an initialization detection circuit for determining that all cells within a row have been initialized, according to one embodiment.

In the second embodiment, a single-ended signal comprising column signal 440 is used for reading the row of memory cells. In such an embodiment, internal state of the row of memory cells needs to be initialized to reliably generate the all cells read signal 514 because a transition from the pre-charge state to the read state only generates a transition on the single-ended signal when the internal state of a given cell is opposite that of a pre-charge value. In one implementation, the single-ended signal is pre-charged to logical zero and internal cell state is a logical one. During a pre-charge state, SA output signal 442 is driven to a logical zero. In a read state, SA output signal 442 transitions to a logical one according to timing of a respective propagation delay path through the associated column of array instance 410. The row of memory cells may be initialized upon power-up or upon reset through an explicit initialization phase performed by a state machine (not shown), or the row of memory cells may be initialized automatically when a time-out interval is exceeded, as discussed previously in FIG. 4C. FIGS. 5B through 5D illustrate circuits that may be used in certain embodiments to detect a time-out event and to initialize each cell within a row of memory cells to a logical one value.

FIG. 5B illustrates a time-out circuit 550, according to the second embodiment. As shown, time-out circuit 550 comprises a chain of NOR gates configured to generate the initialize cells signal 480. The chain of NOR gates provides a delay path from the delay input signal 338 to the initialize cells signal 480. A propagation time through this delay path determines the time-out interval 485. A logical one driven on the all cells read signal 514 causes each NOR gate to transition to a logical zero output, thereby driving the initialize cells signal 480 to a logical zero. After each positive edge on the delay input signal 338, a positive edge on the all cells read signal 514 within the time-out interval 485 inhibits the initialize cells signal 480 from driving a logical one signal, thereby preventing an initialization procedure. However, if the all cells read signal 514 does not present a positive edge within the time-out interval 485, then an initialization procedure may be initiated. Any technically feasible initialization procedure may be implemented. In one embodiment, the initialization procedure includes writing the row of memory cells with a predetermined value, such as a logical one value.

FIG. 5C illustrates a memory cell initialization circuit 560, according to one embodiment. As shown, the cell initialization circuit 560 includes two pass gates 562, 564, such as n-channel FET devices coupled to respective differential bit lines 510(P) and 510(N). The initialize cells signal 580 may be generated based on the initialize cells signal 480 and an all cells initialized signal 515, described below in FIG. 5D.

The initialize cells signal 580 drives the gate nodes of the pass gates 562, 564. During the initialization procedure, the row of memory cells is enabled for access through a row select signal, and the differential bit lines 510(P) and 510(N) are driven to write a logical one value within a corresponding cell.

FIG. 5D illustrates an initialization detection circuit 570 for determining that all cells within a row of memory cells have been initialized, according to one embodiment. As shown, SA outputs 442 of FIG. 4A are combined within a NOR gate 537, which drives an inverter 539 to generate an all cells initialized signal 515. In one embodiment, the initialization detection circuit 570 detects when all cells within the row of memory cells have been initialized to a logical value of one. After all cells have been initialized, as indicated by the all cells initialized signal 515 being asserted to a logical one state, the initialize cells signal 580 may be driven back to a logical zero.

Figure 6:
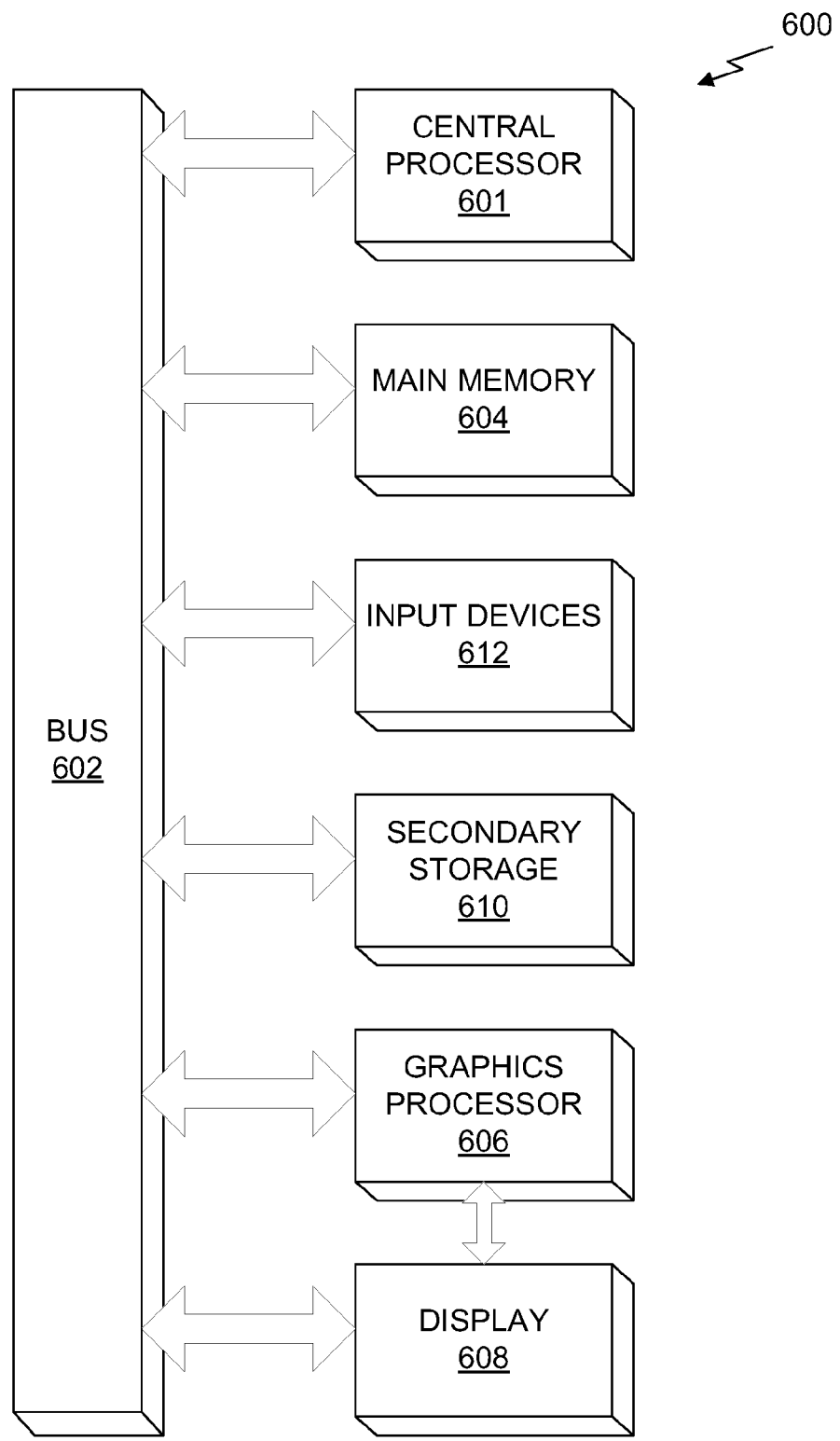
FIG. 6 illustrates an exemplary system in which the various architecture and/or functionality of the various previous embodiments may be implemented.

FIG. 6 illustrates an exemplary system 600 in which the various architecture and/or functionality of the various previous embodiments may be implemented. As shown, a system 600 is provided including at least one central processor 601 that is connected to a communication bus 602. The communication bus 602 may be implemented using any suitable protocol, such as PCI (Peripheral Component Interconnect), PCI-Express, AGP (Accelerated Graphics Port), HyperTransport, or any other bus or point-to-point communication protocol(s). The system 600 also includes a main memory 604. Control logic (software) and data are stored in the main memory 604, which may take the form of random access memory (RAM).

The system 600 also includes input devices 612, a graphics processor 606, and a display 608, i.e. a conventional CRT (cathode ray tube), LCD (liquid crystal display), LED (light emitting diode), plasma display or the like. User input may be received from the input devices 612, e.g., keyboard, mouse, touchpad, microphone, and the like. In one embodiment, the graphics processor 606 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 600 may also include a secondary storage 610. The secondary storage 610 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner. Computer programs, or computer control logic algorithms, may be stored in the main memory 604 and/or the secondary storage 610. Such computer programs, when executed, enable the system 600 to perform various functions. The main memory 604, the storage 610, and/or any other storage are possible examples of computer-readable media.

In one embodiment, the architecture and/or functionality of the various previous figures may be implemented in the context of the central processor 601, the graphics processor 606, an integrated circuit (not shown) that is capable of at least a portion of the capabilities of both the central processor 601 and the graphics processor 606, a chipset (i.e., a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 600 may take the form of a desktop computer, laptop computer, server, workstation, game consoles, embedded system, and/or any other type of logic. Still yet, the system 600 may take the form of various other devices including, but not limited to a personal digital assistant (PDA) device, a mobile phone device, a television, etc.

Further, while not shown, the system 600 may be coupled to a network (e.g., a telecommunications network, local area network (LAN), wireless network, wide area network (WAN) such as the Internet, peer-to-peer network, cable network, or the like) for communication purposes.

In one embodiment, one or more of the central processor 601, main memory 604, input devices 612, or graphics processor 606, or any combination thereof may comprise an integrated circuit 200 that implements a DVCO 220, as described herein.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
transmitting a first signal to a memory delay structure included in a digital voltage controlled oscillator (DVCO), wherein the memory delay structure comprises an array of memory cells configured to model signal propagation through other instances of arrays of memory cells included in a particular clock domain;
selecting a row of memory cells within the array of memory cells;
sensing a plurality of column signals associated with the selected row of memory cells; and
generating a memory delay signature signal based on the plurality of column signals, wherein the memory delay signature signal is configured to indicate a longest propagation delay through the selected row of memory cells.

2. The method of claim 1, wherein selecting the row of memory cells comprises driving an enable signal through a row select line that is coupled to the row of memory cells.

3. The method of claim 2, wherein two or more selected memory cells drive corresponding bit lines in response to the enable signal.

4. The method of claim 3, wherein each of the corresponding bit lines comprises a differential pair.

5. The method of claim 3, further comprising driving each of the corresponding bit lines to a pre-charge state when the first signal is in a logic low state.

6. The method of claim 1, wherein sensing the plurality of column signals comprises determining that at least one bit line associated with each of two or more selected memory cells has transitioned to a logical value of zero.

7. The method of claim 1, further comprising:
determining that a time-out has occurred; and initializing the row of memory cells with a predetermined value.

8. The method of claim 7, wherein determining that the time-out has occurred comprises:
transmitting the first signal to a delay line to generate a delayed signal; and
detecting a transition of the delayed signal prior to detecting a transition of the memory delay signature signal.

9. The method of claim 7, wherein initializing the row of memory cells comprises writing a logical value of one to each of two or more selected memory cells.

10. The method of claim 1, further comprising:
transmitting the first signal to at least one circuit delay structure;
waiting for each of the at least one circuit delay structure to respond to a transition of the first signal; and
generating a first system delay signature signal based on the response to the first signal and the memory delay signature signal.

11. The method of claim 10, wherein one of the at least one circuit delay structure comprises a logic circuit delay structure configured to represent associated logic circuit delay paths.

12. The method of claim 10, wherein one of the at least one circuit delay structures comprises a wiring delay structure configured to represent associated wiring delay paths.

13. The method of claim 10, further comprising:
generating a second signal based on the first system delay signature signal;
transmitting the second signal to the row of memory cells; and
transmitting the second signal to the at least one circuit delay structure.

14. An integrated circuit comprising a digital voltage controlled oscillator (DVCO) configured to:
transmit a first signal to a memory delay structure, wherein the memory delay structure comprises an array of memory cells configured to model signal propagation through other instances of arrays of memory cells included in a particular clock domain;
select a row of memory cells within the array of memory cells;
sense a plurality of column signals associated with the selected row of memory cells; and
generate a memory delay signature signal based on the plurality of column signals, wherein the memory delay signature signal is configured to indicate a longest propagation delay through the selected row of memory cells.

15. The integrated circuit of claim 14, wherein the DVCO is further configured to:
determine that a time-out has occurred; and
initialize the row of memory cells with a predetermined value.

16. The integrated circuit of claim 14, wherein the DVCO is further configured to:
transmit the first signal to at least one circuit delay structure;
wait for each of the at least one circuit delay structure to respond to a transition of the first signal; and
generate a first system delay signature signal based on the response to the first signal and the memory delay signature signal.

17. The integrated circuit of claim 16, wherein the DVCO is further configured to:
generate a second signal based on the first system delay signature signal;
transmit the second signal to the row of memory cells; and
transmit the second signal to the at east one circuit delay structure.

18. A system, comprising:
a processing unit that includes a digital voltage controlled oscillator (DVCO) configured to:
transmit a first signal to a memory delay structure, wherein the memory delay structure comprises an array of memory cells configured to model signal propagation through other instances of arrays of memory cells included in a particular clock domain;
select a row of memory cells within the array of memory cells;
sense a plurality of column signals associated with the selected row of memory cells; and
generate a memory delay signature signal based on the plurality of column signals, wherein the memory delay signature signal is configured to indicate a longest propagation delay through the selected row of memory cells.

19. The system of claim 18, wherein the DVCO is further configured to:
determine that a time-out has occurred; and
initialize the row of memory cells with a predetermined value.

20. The system of claim 18, wherein the DVCO is further configured to:
transmit the first signal to at least one circuit delay structure;
wait for each of the at least one circuit delay structure to respond to a transition of the first signal; and
generate a first system delay signature signal based on the response to the first signal and the memory delay signature signal.

* * * * *

UNITED STATES PATENT AND TRADEMARK OFFICE
CERTIFICATE OF CORRECTION

PATENT NO. : 9,246,481 B2
APPLICATION NO. : 14/162692
DATED : January 26, 2016
INVENTOR(S) : Eric H. Voelkel It is certified that error appears in the above-identified patent and that said Letters Patent is hereby corrected as shown below:

In the Claims

Column 12, Line 18 please replace "at east one" with --at least one--.

Signed and Sealed this
Seventeenth Day of March, 2020

Andrei Iancu
*Director of the United States Patent and Trademark Office*